(12) United States Patent
Hu et al.

(10) Patent No.: US 8,866,189 B2
(45) Date of Patent: Oct. 21, 2014

(54) SILICON-GERMANIUM HETEROJUNCTION BIPOLAR TRANSISTOR AND MANUFACTURING METHOD THEREOF

(71) Applicant: Shanghai Hua Hong Nec Electronics Co., Ltd., Shanghai (CN)

(72) Inventors: Jun Hu, Shanghai (CN); Jing Shi, Shanghai (CN); Wensheng Qian, Shanghai (CN); Donghua Liu, Shanghai (CN); Wenting Duan, Shanghai (CN); Fan Chen, Shanghai (CN); Tzuyin Chiu, Shanghai (CN)

(73) Assignee: Shanghai Hua Hong Nec Electronics Co., Ltd., Shanghai (CN)

( * ) Notice: Subject to any disclaimer, the term of this patent is extended or adjusted under 35 U.S.C. 154(b) by 158 days.

(21) Appl. No.: 13/682,123

(22) Filed: Nov. 20, 2012

(65) Prior Publication Data

US 2013/0140604 A1    Jun. 6, 2013

(30) Foreign Application Priority Data

Nov. 23, 2011    (CN) .......................... 2011 1 0377060

(51) Int. Cl.
| | |
|---|---|
| *H01L 29/737* | (2006.01) |
| *H01L 29/66* | (2006.01) |
| *H01L 29/06* | (2006.01) |
| *H01L 29/10* | (2006.01) |
| *H01L 29/417* | (2006.01) |
| *H01L 29/08* | (2006.01) |

(52) U.S. Cl.
CPC ...... *H01L 29/66234* (2013.01); *H01L 29/0649* (2013.01); *H01L 29/10* (2013.01); *H01L 29/41708* (2013.01); *H01L 29/0821* (2013.01); *H01L 29/737* (2013.01); *H01L 29/7378* (2013.01); *H01L 29/0623* (2013.01); *H01L 29/66242* (2013.01)
USPC ........... 257/191; 257/197; 257/565; 257/156; 257/E21.37; 438/318; 438/312

(58) Field of Classification Search
USPC .................... 257/191, 197, 565, 156, E21.37; 438/318, 312
See application file for complete search history.

(56) References Cited

U.S. PATENT DOCUMENTS

2011/0147892 A1*    6/2011    Chiu et al. .................... 257/565

* cited by examiner

*Primary Examiner* — Cathy N Lam
(74) *Attorney, Agent, or Firm* — MKG, LLC

(57) ABSTRACT

A silicon-germanium (SiGe) heterojunction bipolar transistor (HBT) is disclosed, including: a substrate; two field oxide regions formed in the substrate; two pseudo buried layers, each being formed under a corresponding one of the field oxide regions; a collector region formed between the field oxide regions, the collector region laterally extending under a corresponding one of the field oxide regions and each side of the collector region being connected with a corresponding one of the pseudo buried layers; a matching layer formed under both the pseudo buried layers and the collector region; and two deep hole electrodes, each being formed in a corresponding one of the field oxide regions, the deep hole electrodes being connected to the corresponding ones of the pseudo buried layers for picking up the collector region. A manufacturing method of the SiGe HBT is also disclosed.

16 Claims, 8 Drawing Sheets

SILICON-GERMANIUM HETEROJUNCTION BIPOLAR TRANSISTOR AND MANUFACTURING METHOD THEREOF

CROSS-REFERENCES TO RELATED APPLICATIONS

This application claims the priority of Chinese patent application number 201110377060.1, filed on Nov. 23, 2011, the entire contents of which are incorporated herein by reference.

TECHNICAL FIELD

The present invention relates to semiconductor fabrication, and more particularly, to a silicon-germanium (SiGe) heterojunction bipolar transistor (HBT). The present invention also relates to a method of manufacturing the SiGe HBT.

BACKGROUND

With the development of modern mobile communication and microwave communication as well as demands for high-performance, low-noise and low-cost radio frequency (RF) components, traditional silicon devices can no longer meet new requirements on technical specifications, output power and linearity. Therefore, SiGe HBT devices have been proposed which play an important role in the applications of high-frequency power amplifiers. Compared with gallium arsenide (GaAs) devices, though SiGe HBT devices are at a disadvantage in frequency performance, they can well solve the issue of heat dissipation accompanying with power amplification, benefiting from their better thermal conductivities and good mechanical capacities of their substrates. Moreover, SiGe HBT devices also have better linearity and higher integration level. Further, SiGe HBT devices are well compatible with the conventional silicon process and still belong to the silicon-based technology and the complementary metal oxide semiconductor (CMOS) process, thus reducing manufacturing cost. For these reasons, the SiGe BiCMOS (bipolar complementary metal oxide semiconductor) process provides great convenience for the integration of power amplifiers and logic control circuits.

Currently, silicon-germanium (SiGe) heterojunction bipolar transistors (HBTs) have been widely adopted internationally as high-frequency, high-power amplifier devices for wireless communication products such as power amplifiers and low-noise amplifiers used in mobile phones. In order to improve the output power of an RF power amplifier, it is an effective method to increase its operating current or operating voltage within the normal ranges. Those SiGe HBTs having high breakdown voltages are popularly used because they consume less electric power by allowing a circuit to operate under a smaller current with the same power consumption. Therefore, further increasing the breakdown voltage of a SiGe HBT without deteriorating its characteristic frequency is more and more focused in the research of SiGe HBTs.

SUMMARY OF THE INVENTION

The objective of the present invention is to provide a silicon-germanium (SiGe) heterojunction bipolar transistor (HBT) having an improved breakdown voltage. To this end, the present invention also provides a method of manufacturing the SiGe HBT.

To achieve the foregoing objective, the SiGe HBT provided by the present invention includes: a substrate; two field oxide regions formed in the substrate; two pseudo buried layers, each being formed under a corresponding one of the field oxide regions; a collector region formed between the field oxide regions, each side of the collector region laterally extending under a corresponding one of the field oxide regions and being connected with a corresponding one of the pseudo buried layers; a matching layer formed under both the pseudo buried layers and the collector region; and a deep hole electrode, formed in each of the field oxide regions and being connected to the corresponding one of the pseudo buried layers for picking up the collector region, wherein both of the pseudo buried layers have a doping type same with that of the collector region and have a doping concentration higher than that of the collector region; and the matching layer has a doping type opposite to that of the collector region.

In an embodiment, the SiGe HBT further includes: two base dielectric layers, each being formed on one of the respective field oxide regions; a base region formed both between the base dielectric layers and on surfaces of the base dielectric layers; two emitter dielectric layers formed on the base region; and an emitter region formed both between the emitter dielectric layers and over surfaces of the emitter dielectric layers.

In an embodiment, each of the base dielectric layers includes a silicon oxide layer and a polysilicon layer formed on the silicon oxide layer; the silicon oxide layer has a thickness of 100 Å to 500 Å; and the polysilicon layer has a thickness of 200 Å to 1500 Å.

In an embodiment, the base region has a bottom width greater than or equal to a top width of the collector region; and the emitter region has a bottom width smaller than the top width of the collector region.

In an embodiment, the base region is a SiGe epitaxial layer and has a doping type opposite to that of the collector region.

In an embodiment, each of the emitter dielectric layers includes a silicon oxide layer and a silicon nitride layer formed on the silicon oxide layer.

In an embodiment, the SiGe HBT further includes isolation sidewalls formed on respective sides of a body composed of the emitter dielectric layers and the emitter region.

To achieve the foregoing objective, the method of manufacturing SiGe HBT provided by the present invention includes the following steps:

Step 1: forming two trenches in a substrate, the two trenches isolating an active region between them;

Step 2: forming a pseudo buried layer under each of the trenches;

Step 3: filling silicon oxide into each of the trenches to form field oxide regions and forming a matching layer under the pseudo buried layers and the active region;

Step 4: forming a collector region by photolithography, N-type implantation and thermal drive-in; and forming a deep contact hole in each of the field oxide regions by etching, depositing a titanium layer and/or a titanium nitride layer in the deep contact hole, and filling tungsten into the deep contact hole so as to form a deep hole electrode in each of the field oxide regions.

In an embodiment, in Step 2, the implanted impurity is phosphorus with a dose of $1e^{14}$ cm$^{-2}$ to $1e^{16}$ cm$^{-2}$ and an energy of 2 KeV to 50 KeV.

In an embodiment, in Step 4, the implanted impurity is arsenic or phosphorus.

In an embodiment, the titanium layer and/or the titanium nitride layer is formed by a physical vapor deposition (PVD) or chemical vapor deposition (CVD) method; the titanium layer has a thickness of 100 Å to 500 Å; and the titanium nitride layer has a thickness of 50 Å to 500 Å.

In an embodiment, the method of manufacturing the SiGe HBT further includes:

Step 5: depositing a silicon oxide layer and a polysilicon layer on a surface of the substrate and forming a base window by using a photolithographic and etching process;

Step 6: growing a SiGe epitaxial layer both in the base window and on a surface of the polysilicon layer;

Step 7: etching the SiGe epitaxial layer, the polysilicon layer and the silicon oxide layer to form a base region and a base dielectric layer;

Step 8: depositing an emitter dielectric layer on a surface of the base region and forming an emitter window by using a photolithographic and etching process;

Step 9: depositing an in-situ doped polysilicon both into the emitter window and over a surface of the emitter dielectric layer to form an emitter region; and Step 10: forming isolation sidewalls on respective sides of a body composed of the emitter region and the emitter dielectric layer.

In an embodiment, in Step 5, the silicon oxide layer has a thickness of 100 Å to 500 Å; and the polysilicon layer has a thickness of 200 Å to 1500 Å.

In an embodiment, in Step 9, the implanted impurity is arsenic or phosphorus with a dose of higher than $1e^{15}$ cm$^{-2}$.

The present invention provides a SiGe HBT with a higher breakdown voltage by introducing pseudo buried layers and a matching layer instead of altering the thickness or doping concentration of the collector region. Compared to conventional devices which employ a uniformly doped N-type buried layer (NBL) that has to be picked up by a contact hole formed in the active region, in the SiGe HBT of the present invention, heavily doped N-type pseudo buried layers are formed under respective field oxide regions on corresponding sides of the active region, and the collector region can be directly picked up via the pseudo buried layers that are connected to respective deep hole electrodes formed in the corresponding field oxide regions. Such design allows the active region not to be involved in picking up the buried layers and hence results in great reduction of device size and area. Moreover, by lightly doping the collector region formed between the pseudo buried layers, a higher breakdown voltage of the collector-base (BC) junction can be achieved, and thus the breakdown voltage BVCEO of the whole device is improved.

Further, different from the BC junction of a conventional HBT which is a one-dimensional depletion region, the BC junction of the SiGe HBT of this invention has a two-dimensional depletion structure, in which there is not only a certain depth of depletion towards the substrate but also lateral depletion from the center of the device to both the pseudo buried layers on the two opposing sides. Moreover, the addition of a matching layer results in that a lightly doped region located under the field oxide regions will be completely depleted before the breakdown of the BC junction. This can help withstand part of the voltage applied to the device and thus result in a higher breakdown voltage of the device. Furthermore, the present invention can address the too large device area issue of conventional devices caused by using an N-sinker (i.e., an N-type buried layer) to pick up the collector and can obtain a collector region with a lower parasitic resistance, by picking up the collector via deep hole electrodes formed in the field oxide regions and connected to the corresponding pseudo buried layers.

BRIEF DESCRIPTION OF THE DRAWINGS

The present invention will be described and specified below with reference to accompanying drawings and exemplary embodiments.

DETAILED DESCRIPTION

As used herein, the singular forms "a", "an" and "the" may be intended to include the plural forms as well, unless the context clearly indicates otherwise.

Figure 1:
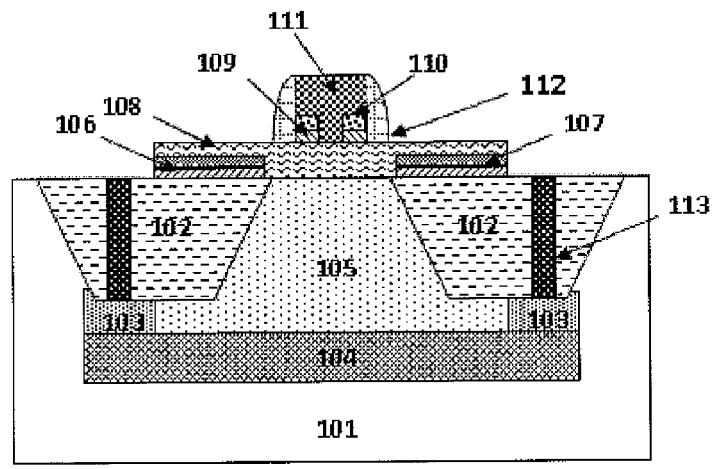
FIG. 1 is a schematic illustration of a SiGe HBT constructed according to an embodiment of the present invention.

FIG. 1 shows a silicon-germanium (SiGe) heterojunction bipolar transistor (HBT) according to an embodiment of the present invention. The SiGe HBT includes: a substrate 101 in which field oxide regions 102, pseudo buried layers 103, a matching layer 104 and a collector region 105 are formed, both the pseudo buried layers 103 and the collector region 105 being formed above the matching layer 104, each of the field oxide regions 102 being formed over a corresponding one of the pseudo buried layers 103 and a portion of the collector region 105, the pseudo buried layers 103 being formed on respective opposing sides of the collector region 105, the field oxide regions 102 being also formed on respective opposing sides of the collector region 105; a silicon oxide layer 106 formed on each of the field oxide regions 102; a polysilicon layer 107 formed on a corresponding one of the silicon oxide layers 106; a base region 108 formed partly on the collector region 105, partly on the portions of the field oxide regions 102 and partly on the polysilicon layers 107; two silicon oxide dielectric layers 109 formed on the base region 108; a silicon nitride dielectric layer 110 formed on each of the silicon oxide dielectric layers 109; an emitter region 111 formed partly on the portion of base region 108 and partly on the silicon nitride dielectric layers 110; isolation sidewalls 112 formed on respective sides of a laminated body composed of the silicon oxide dielectric layers 109, silicon nitride dielectric layers 110 and the emitter region 111; and deep hole electrodes 113 for picking up the respective pseudo buried layers 103, each deep hole electrode 113 being formed by etching a deep contact hole, forming a titanium layer and/or a titanium nitride layer in the deep contact hole and filling tungsten into the deep contact hole.

In this embodiment, the substrate 101 is a P-type substrate, and each of the pseudo buried layers 103, the collector region 105 and the emitter region 111 is doped with an N-type impurity. Preferably, the N-type impurity doped in the pseudo buried layers 103 is phosphorus, and both the collector region 105 and the emitter region 111 are doped with phosphorus or arsenic. The matching layer 104 is doped with an impurity having an opposite conductivity type to that of the impurity doped in the collector region 105, i.e., the matching layer 104 is doped with a P-type impurity. The base region 108 is doped with a P-type impurity which may be boron.

In this embodiment, the width of the bottom of the base region 108, namely, the width of a base window described below, is greater than or equal to the width of the top of the collector region 105. The width of the bottom of the emitter region 111, namely, the width of an emitter window described below, is smaller than the width of the top of the collector region 105. The silicon oxide layer 106 may have a thickness of 100 Å to 500 Å and the polysilicon layer 107 may have a thickness of 200 Å to 1500 Å. In each of the deep contact holes 113, the titanium layer may have a thickness of 100 Å to 500 Å and the titanium nitride layer may have a thickness of 50 Å to 500 Å.

Figure 2:
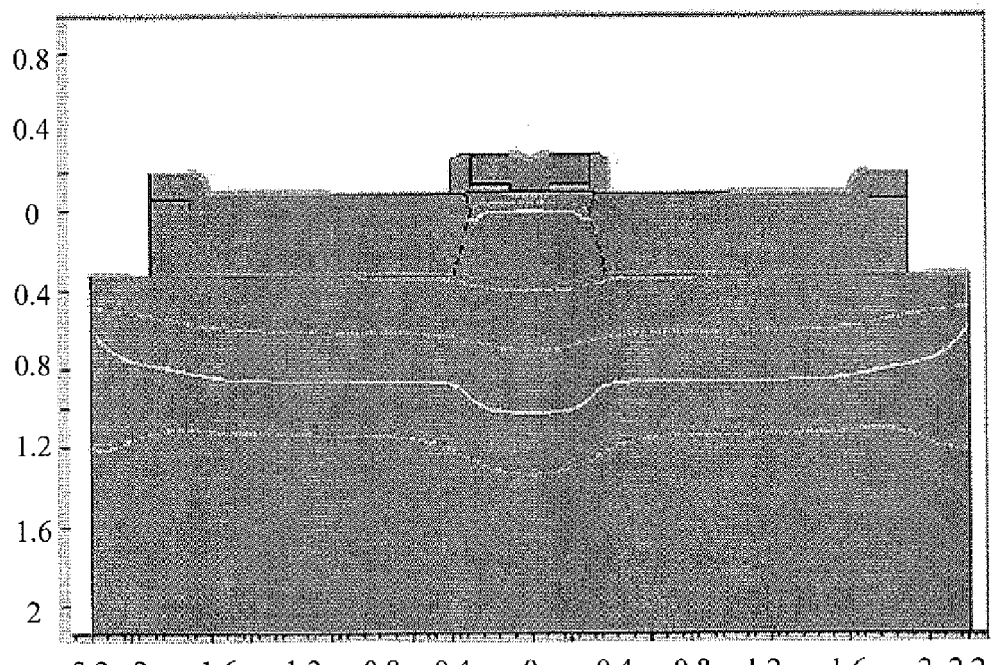
FIG. 2 is a diagram schematically showing a depletion region distribution of the SiGe HBT of FIG. 1 when a low reverse biased voltage is applied.
Figure 3:
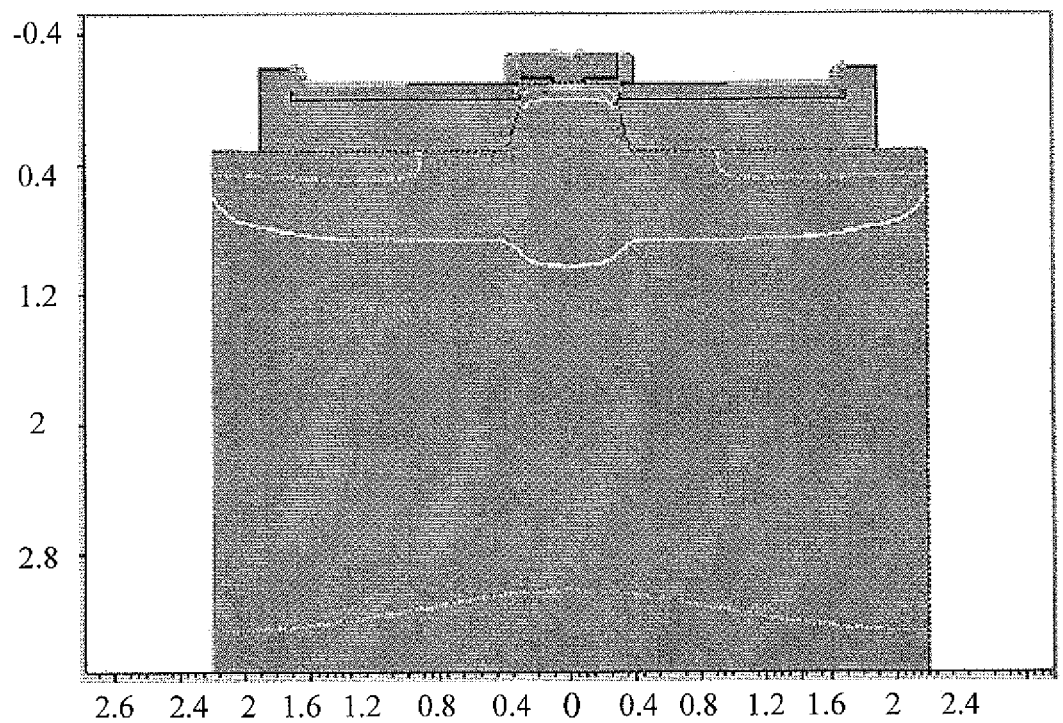
FIG. 3 is a diagram schematically showing another depletion region distribution of the SiGe HBT of FIG. 1 when a high reverse biased voltage is applied.

The SiGe HBT of the present invention has a higher breakdown voltage by adding the pseudo buried layers 103 and the matching layer 104 to a conventional SiGe HBT. With such additions, the breakdown of the device is not determined by a single depletion region of the vertical base-collector (BC) junction anymore. A lateral depletion region will also be formed which can help to withstand part of the voltage applied to the device. Referring to FIG. 2 as well as FIG. 1, when a low reverse biased voltage is applied, depletion regions are formed around the BC junction and the matching layer 104. As shown in FIG. 3, when this reverse biased voltage is increased to a certain value, a depletion region is laterally broken into two parts before the BC junction is broken down. Since most of the reverse biased voltage is withstood by the lateral depletion region, such a depletion mechanism may result in a breakdown voltage of the device far greater than that of the BC junction. Thus, it could be found that the present invention is able to increase the breakdown voltage BVCEO of the device without altering the depth or doping concentration of its collector region.

Figure 4:
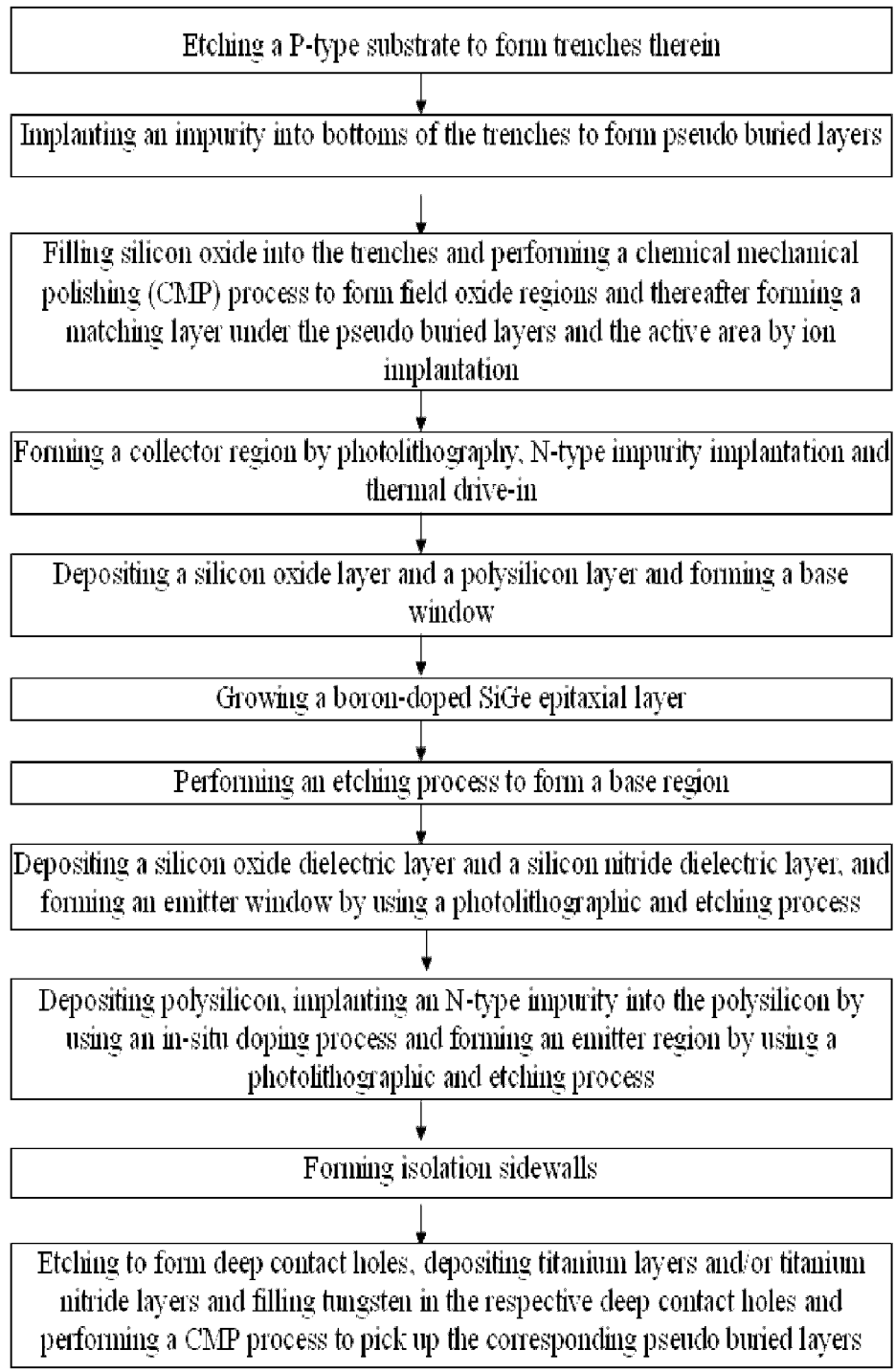
FIG. 4 is a flow chart showing a method of manufacturing SiGe HBT according to an embodiment of the present invention.
Figure 5:
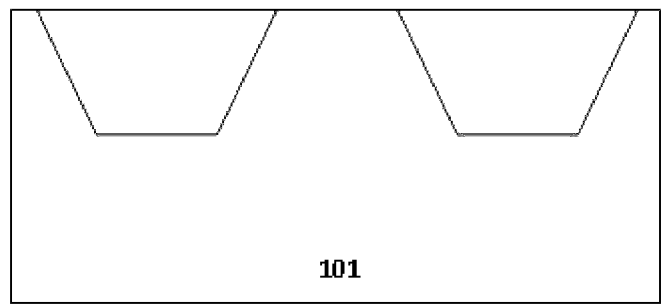
FIG. 5 depicts the structure of device after performing step 1 of the manufacturing method according to an embodiment of the present invention.
Figure 6:
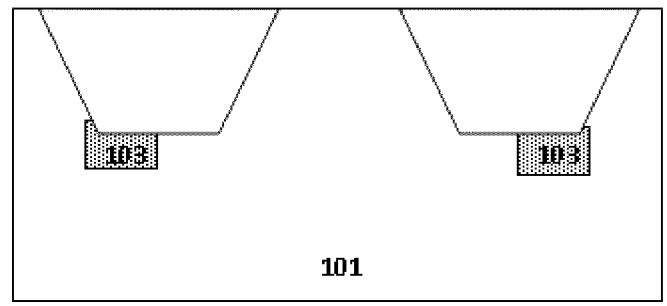
FIG. 6 depicts the structure of device after performing step 2 of the manufacturing method according to an embodiment of the present invention.
Figure 7:
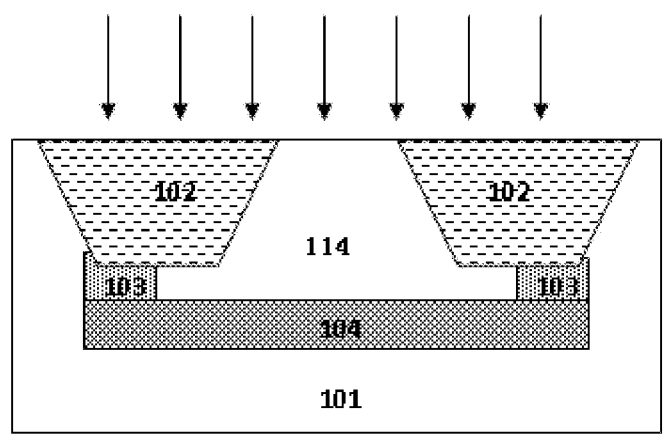
FIG. 7 depicts the structure of device after performing step 3 of the manufacturing method according to an embodiment of the present invention.
Figure 8:
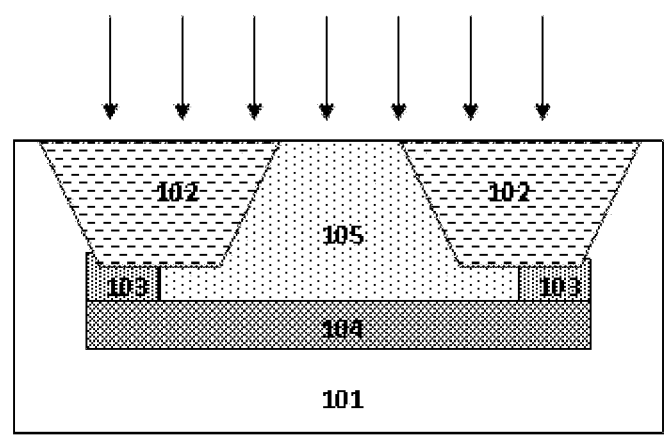
FIG. 8 depicts the structure of device after performing step 4 of the manufacturing method according to an embodiment of the present invention.
Figure 9:
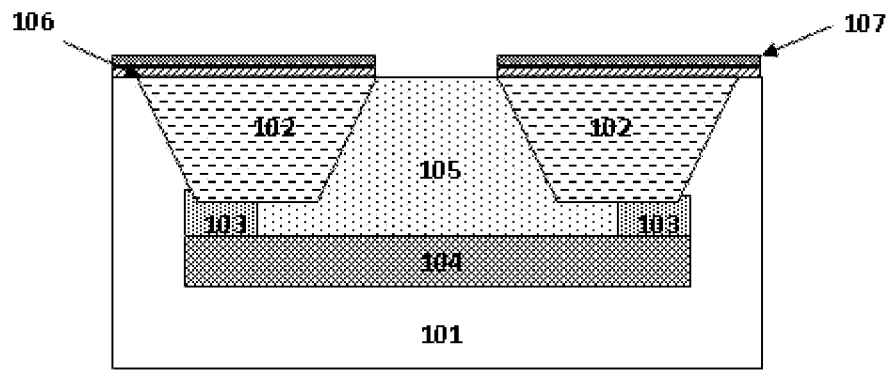
FIG. 9 depicts the structure of device after performing step 5 of the manufacturing method according to an embodiment of the present invention.
Figure 10:
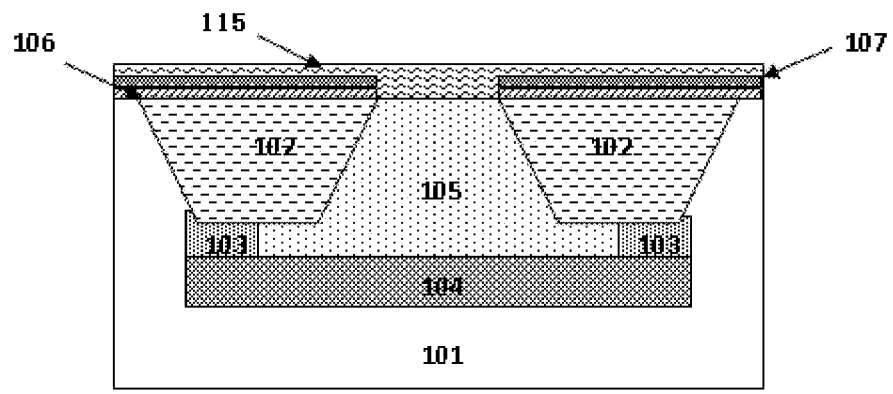
FIG. 10 depicts the structure of device after performing step 6 of the manufacturing method according to an embodiment of the present invention.
Figure 11:
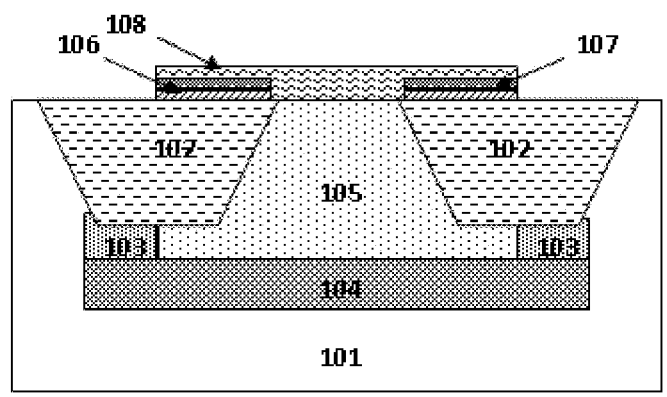
FIG. 11 depicts the structure of device after performing step 7 of the manufacturing method according to an embodiment of the present invention.
Figure 12:
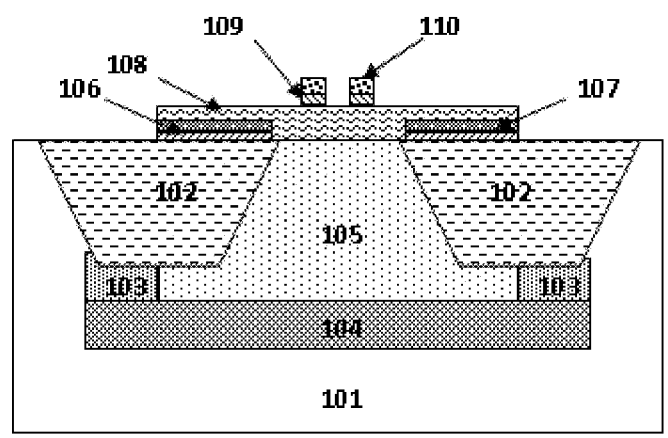
FIG. 12 depicts the structure of device after performing step 8 of the manufacturing method according to an embodiment of the present invention.
Figure 13:
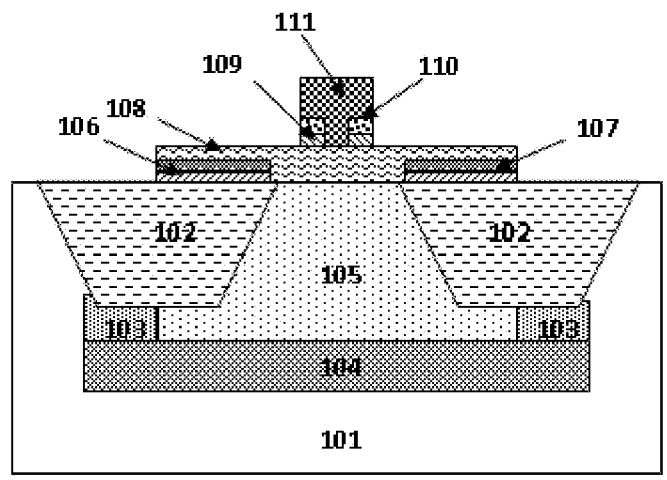
FIG. 13 depicts the structure of device after performing step 9 of the manufacturing method according to an embodiment of the present invention.
Figure 14:
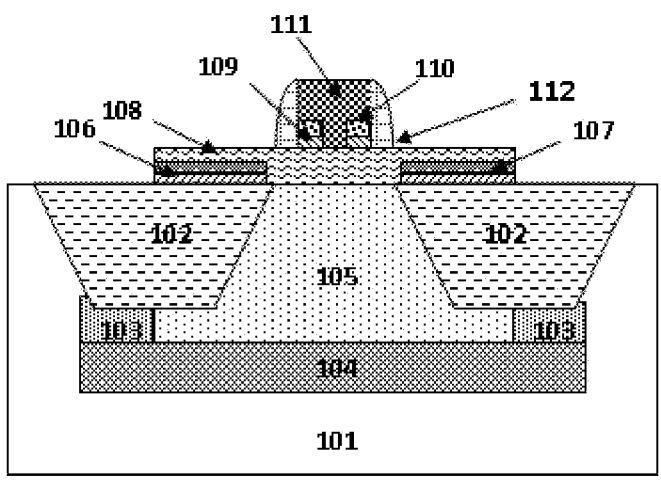
FIG. 14 depicts the structure of device after performing step 10 of the manufacturing method according to an embodiment of the present invention.

A method of manufacturing the SiGe HBT according to an embodiment of the present invention will be described below with reference to FIG. 4 as well as FIGS. 5 to 14. The method includes the following steps:

Step 1: as shown in FIG. 5, forming two trenches in a P-type substrate 101, the trenches isolating an active region 114 between them;

Step 2: as shown in FIG. 6, implanting an N-type impurity into the bottoms of the trenches to form pseudo buried layers 103 under the corresponding trenches, wherein the N-type impurity is, for example, phosphorus; the implantation dose may be $1e^{14}$ cm$^{-2}$ to $1e^{16}$ cm$^{-2}$; and the implantation energy may be 2 KeV to 50 KeV;

Step 3: as shown in FIG. 7, filling silicon oxide into the trenches and performing a chemical mechanical polishing (CMP) process to form field oxide regions 102, and thereafter forming a matching layer 104 below the pseudo buried layers 103 and the active region 114 by ion implantation;

Step 4: as shown in FIG. 8, forming a collector region 105 by photolithography, N-type impurity implantation and thermal drive-in, wherein the implanted N-type impurity is, for example, arsenic or phosphorus; the formed collector region 105 is surrounded by the two pseudo buried layers 103, the two field oxide regions 102 and the matching layer 104; and on its each side, the formed collector region 105 has an extending portion which is located under a corresponding field oxide region 102 and contacts with a corresponding pseudo buried layer 103;

Step 5: as shown in FIG. 9, depositing a silicon oxide layer 106 and then depositing a polysilicon layer 107 on the surface of the substrate 101, and forming a base window by using a photolithographic and etching process, wherein the deposited silicon oxide layer has a thickness of, for example, 100 Å to 500 Å, and the deposited polysilicon layer has a thickness of, for example, 200 Å to 1500 Å;

Step 6: as shown in FIG. 10, growing a SiGe epitaxial layer 115 which is formed partly within the base window and partly on the surface of the polysilicon layer 107, wherein the SiGe epitaxial layer 115 is doped with an N-type impurity which is, for example, boron;

Step 7: as shown in FIG. 11, performing an etching process to form a base region 108 and also to form a base dielectric layer by etching the polysilicon layer 107 and the silicon oxide layer 106;

Step 8: as shown in FIG. 12, depositing a silicon oxide dielectric layer 109 and then depositing a silicon nitride dielectric layer 110 on the base region 108, and forming an emitter window by using a photolithographic and etching process, wherein the etched silicon oxide dielectric layer 109 and silicon nitride dielectric layer 110 jointly serve as an emitter dielectric layer;

Step 9: as shown in FIG. 13, depositing polysilicon into the emitter window and on the surface of the silicon nitride dielectric layer 110, implanting an N-type impurity into the polysilicon by using an in-situ doping process and forming an emitter region 111 by using a photolithographic and etching process, wherein the implanted N-type impurity is, for example, arsenic or phosphorus, and the implantation dose is greater than $1e^{15}$ cm$^{-2}$;

Step 10: as shown in FIG. 14, forming isolation sidewalls 112 on both sides of a body composed of the silicon oxide dielectric layer 109, silicon nitride dielectric layer 110 and the emitter region 111; and Step 11: etching the field oxide regions 102 located above the respective pseudo buried layers 103 to form deep contact holes which contact with the corresponding pseudo buried layers 103, and forming deep hole electrodes in the respective deep contact holes by depositing titanium layers and/or titanium nitride layers in the respective deep contact holes, filling tungsten therein and performing a CMP process, such that the deep hole electrodes pick up the corresponding pseudo buried layers 103 and the device shown in FIG. 1 is formed, wherein the titanium layers and/or titanium nitride layers may be deposited by using a physical vapor deposition (PVD) method or a chemical vapor deposition (CVD) method; the deposited titanium layers may have a thickness of 100 Å to 500 Å; and deposited titanium nitride layers may have a thickness of 50 Å to 500 Å.

While a number of specific examples and embodiments have been presented in the foregoing description, they are not intended to limit the invention in any way. It will be apparent to those skilled in the art that various modifications and variations can be made without departing from the spirit or scope of the invention. Thus, it is intended that the present invention covers all such modifications and variations.

What is claimed is:

1. A silicon-germanium (SiGe) heterojunction bipolar transistor (HBT), comprising:
   a substrate;
   two field oxide regions formed in the substrate;
   two pseudo buried layers, each being formed under a corresponding one of the field oxide regions;
   a collector region formed between the field oxide regions, each side of the collector region laterally extending under a corresponding one of the field oxide regions and being connected with a corresponding one of the pseudo buried layers;
   a matching layer formed under both the pseudo buried layers and the collector region; and
   a deep hole electrode, formed in each of the field oxide regions and being connected to the corresponding one of the pseudo buried layers for picking up the collector region,
   wherein both of the pseudo buried layers have a doping type same with that of the collector region and have a doping concentration higher than that of the collector region; and the matching layer has a doping type opposite to that of the collector region.

2. The SiGe HBT according to claim 1, further comprising:
   two base dielectric layers, each being formed on a corresponding one of the field oxide regions;
   a base region formed both between the base dielectric layers and on surfaces of the base dielectric layers;
   two emitter dielectric layers formed on the base region; and
   an emitter region formed both between the emitter dielectric layers and over surfaces of the emitter dielectric layers.

3. The SiGe HBT according to claim 2, wherein each of the base dielectric layers includes a silicon oxide layer and a polysilicon layer formed on the silicon oxide layer.

4. The SiGe HBT according to claim 3, wherein the silicon oxide layer has a thickness of 100 Å to 500 Å.

5. The SiGe HBT according to claim 3, wherein the polysilicon layer has a thickness of 200 Å to 1500 Å.

6. The SiGe HBT according to claim 2, wherein the base region has a bottom width greater than or equal to a top width of the collector region.

7. The SiGe HBT according to claim 2, wherein the base region is a SiGe epitaxial layer and has a doping type opposite to that of the collector region.

8. The SiGe HBT according to claim 2, wherein each of the emitter dielectric layers includes a silicon oxide layer and a silicon nitride layer formed on the silicon oxide layer.

9. The SiGe HBT according to claim 2, wherein the emitter region has a bottom width smaller than a top width of the collector region.

10. The SiGe HBT according to claim 2, further comprising isolation sidewalls formed on respective sides of a body composed of the emitter dielectric layers and the emitter region.

11. A method of manufacturing the SiGe HBT according to claim 1, the method comprising:
    forming two trenches in a substrate, the two trenches isolating an active region between them;
    forming a pseudo buried layer under each of the trenches;
    filling silicon oxide into each of the trenches to form field oxide regions and forming a matching layer under the pseudo buried layers and the active region;
    forming a collector region by photolithography, N-type implantation and thermal drive-in; and
    forming a deep contact hole in each of the field oxide regions by etching, depositing a titanium layer and/or a titanium nitride layer in the deep contact hole, and filling tungsten into the deep contact hole so as to form a deep hole electrode in each of the field oxide regions.

12. The method according to claim 11, wherein each of the pseudo buried layers is formed by ion implantation with a dose of $1e^{14}$ cm$^{-2}$ to $1e^{16}$ cm$^{-2}$ and an energy of 2 KeV to 50 KeV.

13. The method according to claim 11, wherein the titanium layer and/or the titanium nitride layer is formed by a physical vapor deposition or a chemical vapor deposition method; the titanium layer has a thickness of 100 Å to 500 Å; and the titanium nitride layer has a thickness of 50 Å to 500 Å.

14. The method according to claim 11, further comprising the following steps after forming the collector region and before forming deep hole electrodes:
    depositing a silicon oxide layer and a polysilicon layer on a surface of the substrate and forming a base window by using a photolithographic and etching process;
    growing a SiGe epitaxial layer both in the base window and on a surface of the polysilicon layer;
    etching the SiGe epitaxial layer, the polysilicon layer and the silicon oxide layer to form a base region and a base dielectric layer;
    depositing an emitter dielectric layer on a surface of the base region and forming an emitter window by using a photolithographic and etching process;
    depositing an in-situ doped polysilicon both into the emitter window and over a surface of the emitter dielectric layer to form an emitter region; and
    forming isolation sidewalls on respective sides of a body composed of the emitter region and the emitter dielectric layer.

15. The method according to claim 14, wherein the silicon oxide layer has a thickness of 100 Å to 500 Å; and the polysilicon layer has a thickness of 200 Å to 1500 Å.

16. The method according to claim 14, wherein the in-situ doped polysilicon is formed by impurity implantation with a dose of higher than $1e^{15}$ cm$^{-2}$.

* * * * *